United States Patent
Su et al.

(10) Patent No.: US 6,221,697 B1
(45) Date of Patent: Apr. 24, 2001

(54) CHIP SCALE PACKAGE AND MANUFACTURING METHOD THEREOF

(75) Inventors: Ching-Huei Su; Chih-Chang Yang, both of Kaohsiung; Shyh-Wei Wang, Tainan; Chih-Sien Yeh, Kaohsiung Hsien, all of (TW)

(73) Assignee: Advanced Semiconductor Engineering, Inc., Kaoshiung (TW)

( * ) Notice: Subject to any disclaimer, the term of this patent is extended or adjusted under 35 U.S.C. 154(b) by 0 days.

(21) Appl. No.: 09/475,232

(22) Filed: Dec. 30, 1999

(30) Foreign Application Priority Data

Oct. 19, 1999 (TW) .................................................. 88118261

(51) Int. Cl.⁷ ............................ H01L 21/44; H01L 21/48; H01L 21/50; H01L 23/04; H01L 23/28
(52) U.S. Cl. ........................... 438/127; 438/108; 257/698; 257/778; 257/787
(58) Field of Search ..................................... 438/127, 106, 438/107, 108, 125, 126; 257/678, 684, 698, 738, 778, 787

(56) References Cited

U.S. PATENT DOCUMENTS 5,710,071 * 1/1998 Beddingfield et al. ............... 438/108

* cited by examiner

*Primary Examiner*—Long Pham
*Assistant Examiner*—Neal Berezny
(74) *Attorney, Agent, or Firm*—Stevens, Davis, Miller & Mosher, LLP

(57) ABSTRACT

A chip scale package mainly comprises two elastomer pads respectively interposed between a substrate and a semiconductor chip. Each of the elastomer pads is respectively situated on the flank of a slot centrally defined in the substrate, and keeps a predetermined distance from the slot. The semiconductor chip is attached onto the upper surface of the substrate through the two elastomer pads wherein bonding pads formed on the semiconductor chip are exposed from the slot of the substrate. The upper surface of the substrate is provided with a plurality of solder pads and leads. Each of the leads has one end electrically connected to a corresponding solder pad, and the other end electrically connected to a corresponding bonding pad of the semiconductor chip. The substrate has a plurality of through-holes formed corresponding to the solder pads such that each solder pad has a portion exposed within the through-hole for mounting a solder ball. The chip scale package is electrically connected to outside through the solder balls. The slot of the substrate and the periphery of the semiconductor chip are sealed by an integrally formed package body. The present invention is characterized in that the encapsulation process of the chip scale package is carried out by a single step of dispensing and curing, so as to increase UPH (unit per hour) thereby shortening encapsulation cycle time. Moreover, the occurrence of flash on the substrate surface around the slot during encapsulation can be reduced, thereby assuring the solder joint reliability of the solder pads.

4 Claims, 5 Drawing Sheets

CHIP SCALE PACKAGE AND MANUFACTURING METHOD THEREOF

BACKGROUND OF THE INVENTION

1. Field of the Invention

This invention relates to a semiconductor device, and more specifically to a chip scale package for use in packaging a central-pad die and a manufacturing method thereof.

2. Description of the Related Art

FIG. 1 depicts a conventional chip scale package 100 comprising an elastomer pad 110 with a slot 110*a* centrally defined therein interposed between a substrate 120 and a semiconductor chip 130. One purpose of the elastomer pad 110 is to obtain suitable reliability by minimizing CTE mismatch stress between the substrate 120 and the semiconductor chip 130.

The semiconductor chip 130 has a plurality of bonding pads 132 disposed centrally thereon. The substrate 120 includes a plurality of solder pads 122 and leads 124 provided on the upper surface thereof. The solder pads 122 are electrically connected to the corresponding leads 124 through conductive traces on the substrate 120. The substrate 120 has a plurality of through-holes respectively corresponding to the solder pads 122 such that each of the solder pads 122 has at least a portion exposed from its corresponding through-hole for mounting a solder ball 126. The substrate 120 has a slot 120*a* corresponding to the slot 110*a* of the elastomer pad 110 (see FIG. 2). The leads 124 are bonded to their corresponding bonding pads 132 of the semiconductor chip 130 for electrically connecting the semiconductor chip 130 to the substrate 120.

The encapsulation process of the chip scale package 100 typically comprises the steps of: (a) dispensing encapsulant into the slot 120*a* of the substrate 120 (see FIG. 3) to seal the leads 124, and then curing the encapsulant by baking to form the package body 140; and (b) flipping the product of step (a) over, then dispensing another encapsulant around the semiconductor chip 130 (see FIG. 4), and curing the encapsulant by baking to form the package body 150.

Since the encapsulation process of the chip scale package 100 must be carried out by repeating the steps of dispensing and curing twice, the encapsulation cycle time is prolonged. Therefore, the cost and cycle time for packaging a semiconductor chip is increased. Moreover, since the slot 120*a* of the substrate 120 is rather narrow, it is very difficult for dispensing the encapsulant into it. The encapsulant must be dispensed in precise amount and with proper flow, or it is easy to form flash on the substrate surface around the slot 120*a*, which in turn may contaminate the solder pads.

SUMMARY OF THE INVENTION

It is a primary object of the present invention to provide a chip scale package in which the encapsulation process thereof is carried out by a single step of dispensing and curing so as to increase UPH (unit per hour), thereby reducing cost for manufacturing the package.

It is another object of the present invention to provide a chip scale package to reduce the occurrence of flash on the substrate surface around the slot during encapsulation, thereby assuring the solder joint reliability of the solder pads.

The chip scale package according to a preferred embodiment of the present invention mainly comprises two elastomer pads interposed between a substrate and a semiconductor chip. Each of the elastomer pads is respectively disposed on the flank of a slot centrally defined in the substrate, and keeps a predetermined distance from the slot. The semiconductor chip has a plurality of bonding pads at its central area for electrically accessing the inner circuits thereof. The semiconductor chip is attached onto the upper surface of the substrate through the two elastomer pads wherein the bonding pads of the semiconductor chip are corresponding to the slot of the substrate. The upper surface of the substrate is provided with a plurality of solder pads and leads. Each of the leads has one end electrically connected to a corresponding solder pad, and the other end electrically connected to a corresponding bonding pad of the semiconductor chip. The substrate has a plurality of through-holes formed corresponding to the solder pads such that each solder pad has a portion exposed within the through-hole for mounting a solder ball. The chip scale package is electrically connected to outside circuits through the solder balls.

Since the two elastomer pads are respectively situated on both flanks of the slot of the substrate and keep a predetermined distance from the slot in such a manner that the space around the chip communicates with the slot of the substrate, the encapsulant dispensed around the semiconductor chip during encapsulation process of the package will automatically fill the slot of the substrate via capillary action.

Therefore, the encapsulation process of the package in accordance with the present invention can be carried out by a single step of dispensing and curing; hence, the encapsulation cycle time is shortened, which in turn increase UPH and reduces the cost for manufacturing the package. Moreover, since the encapsulant fills the slot of the substrate via capillary action, it is not easy for the encapsulant to overflow the slot and form flash on the substrate surface, thereby assuring the solder joint reliability of the solder pads.

BRIEF DESCRIPTION OF THE DRAWINGS

Other objects, advantages, and novel features of the invention will become more apparent from the following detailed description when taken in conjunction with the accompanying drawings.

DETAILED DESCRIPTION OF THE PREFERRED EMBODIMENT

Figure 5:
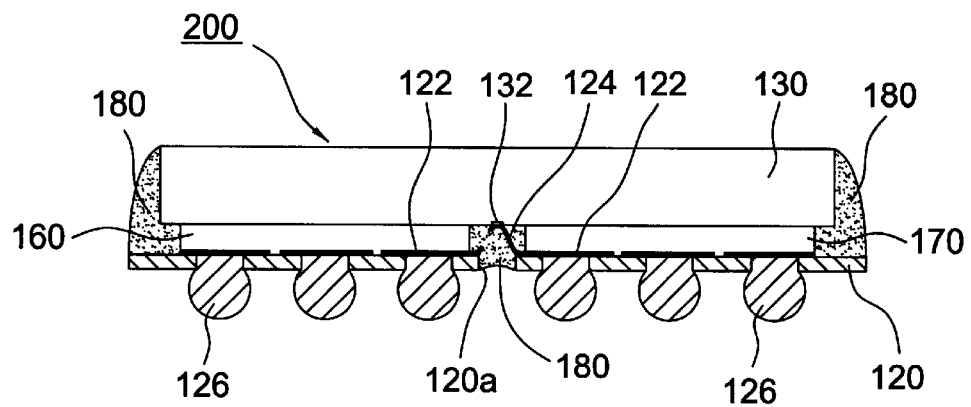
FIG. 5 is a cross-sectional view of a chip scale package according to a preferred embodiment of the present invention.
Figure 6:
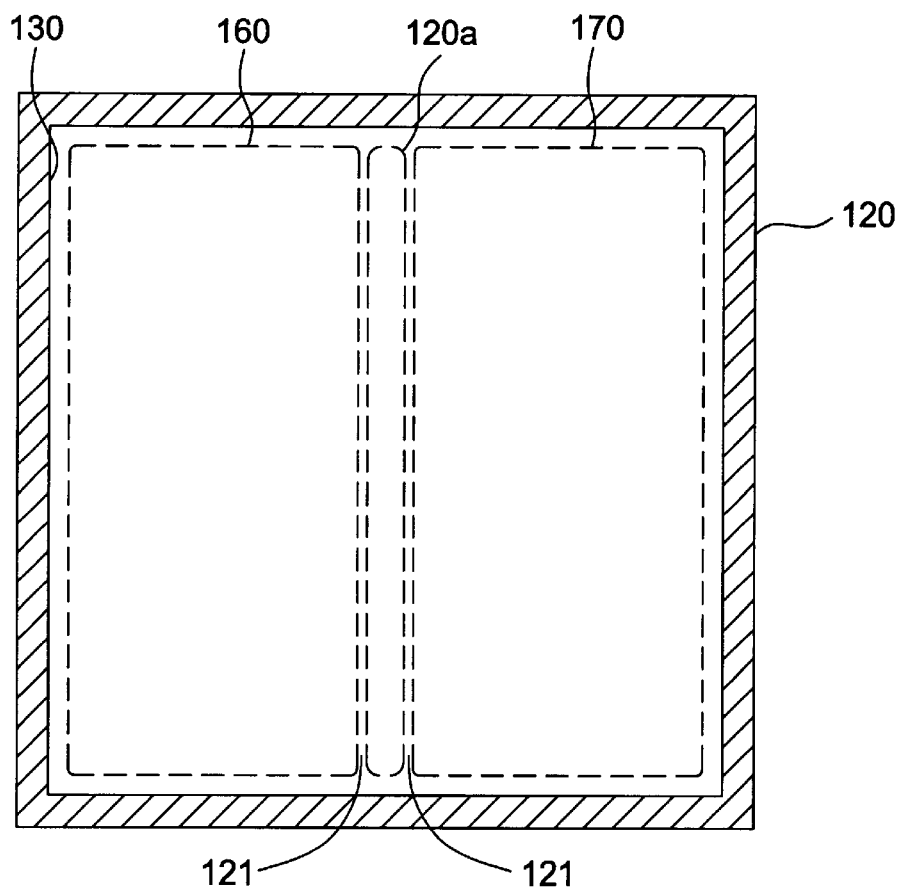
FIG. 6 is a top plan view of two elastomer pads interposed between a substrate and a semiconductor chip for use in the chip scale package of FIG. 5 in accordance with the present invention.

FIG. 5 discloses a chip scale package 200 according to a preferred embodiment of the present invention comprising two elastomer pads 160, 170 interposed between a substrate 120 and a semiconductor chip 130. Each of the elastomer pads 160, 170 is respectively disposed on the flank of a slot 120a defined in the substrate 120, and keeps a predetermined distance 121 (see FIG. 6) from the slot 120a. The semiconductor chip 130 has a plurality of bonding pads 132 centrally formed thereon for electrically accessing the inner circuits thereof. The semiconductor chip 130 is attached onto the upper surface of the substrate 120 through the two elastomer pads 160, 170 wherein the bonding pads 132 of the semiconductor chip 130 are exposed from the slot 120a of the substrate 120.

Referring to FIG. 5 again, the upper surface of the substrate 120 is provided with a plurality of solder pads 122 and leads 124. Each of the solder pads 122 is connected to one end of a corresponding lead 124 through conductive trace on the substrate 120. The other end of the lead 124 is electrically connected to a corresponding bonding pad 132 of the semiconductor chip 130. The substrate 120 has a plurality of through-holes formed corresponding to the solder pads 122. Each solder pad 122 is provided with a solder ball 126 for making external electrical connection.

Referring to FIG. 5 again, the chip scale package 200 in accordance with the present invention comprises a package body 180 for preventing the package 200 from moisture or contamination. The package body 180 includes a first portion formed on the upper surface of the substrate 120 around the chip 130 and a second portion formed within the slot 120a of the substrate 120 for sealing the leads 124, wherein the two portions are formed substantially at the same time.

FIGS. 7–10 show a method of making the chip scale package 200 of the present invention.

Figure 7:
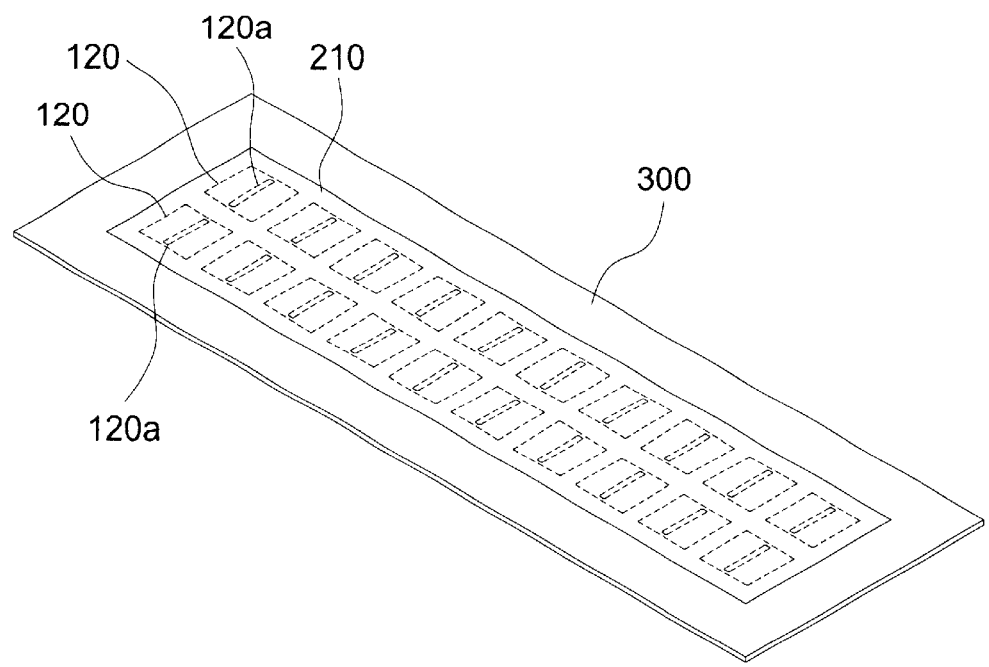
FIGS. 7–10 illustrate a method of making the chip scale package of FIG. 5 in accordance with the present invention.

FIG. 7 discloses a substrate strip 210 according to a preferred embodiment of the present invention. The substrate strip 210 is securely mounted on a process carrier 300. The substrate strip 210 includes a plurality of substrates 120 for use in forming a plurality of substrate-based semiconductor chip packages. Each of the substrates 120 has a slot 120a centrally defined therein (for simplicity, only two slots are denoted with the numeral 120a in FIG. 7).

Figure 8:
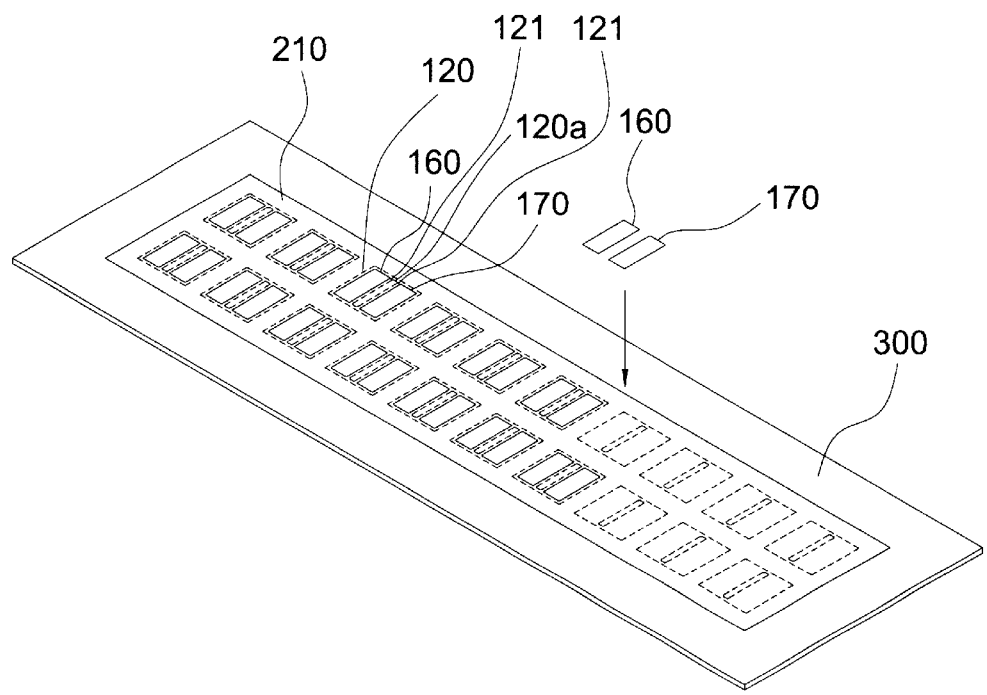

FIG. 8 shows that two elastomer pads 160, 170 are attached onto the upper surface of each substrate 120 in a manner that each of the elastomer pads 160, 170 is respectively disposed on the flank of the slot 120a of each substrate 120, and keeps a predetermined distance 121 from the slot 120a. It is noted that if the predetermined distance 121 (referring to FIG. 6) keeps too small, the capillary action of encapsulant will be lessened; if the predetermined distance 121 keeps too large, flash will be easily formed on the surface of the substrate 120. According to the present invention, the distance 121 between the elastomer pad 160 and the slot 120a preferably keeps within 0.05–0.15 cm.

Hereafter, the method is generally described with respect to a single substrate. It is to be understood that each of the steps described below with respect to a single substrate is applied to each of the substrates 120 in the substrate strip 120.

Figure 9:
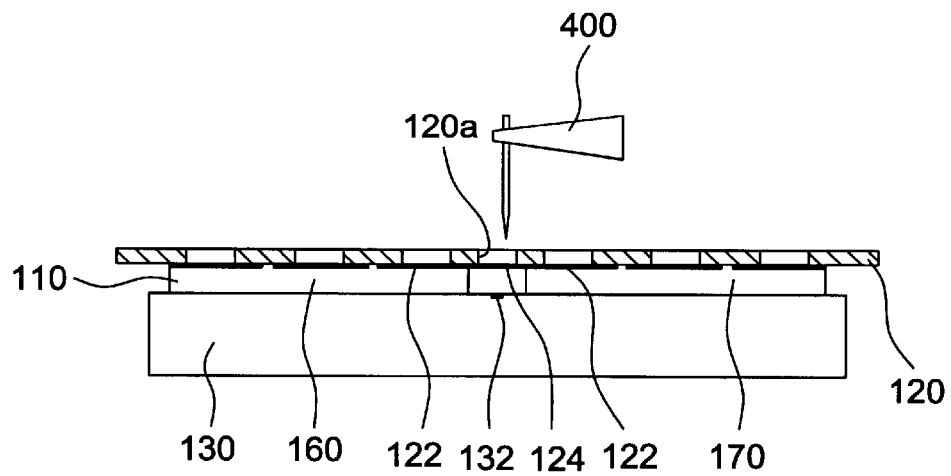

FIG. 9 shows the semiconductor chip 130 securely attached onto the upper surface of the substrate 120 through the elastomer pads 160, 170 in a manner that the bonding pads 132 thereof are exposed from the corresponding slot 120a of the substrate 120. Then a bonding tool 400 moves one end of each of the leads 124 down to the bonding pad 132 on the semiconductor chip 130 and bonds the lead thermosonically such that the end of each of the leads 124 is electrically connected to a corresponding bonding pad 132 (see FIG. 5).

Suitable elastomer pads may be purchased from Hitachi Chemical Co., Ltd. under the trade name of HS-205T, or purchased from Ablestik under the trade name of HS-205T.

Figure 10:
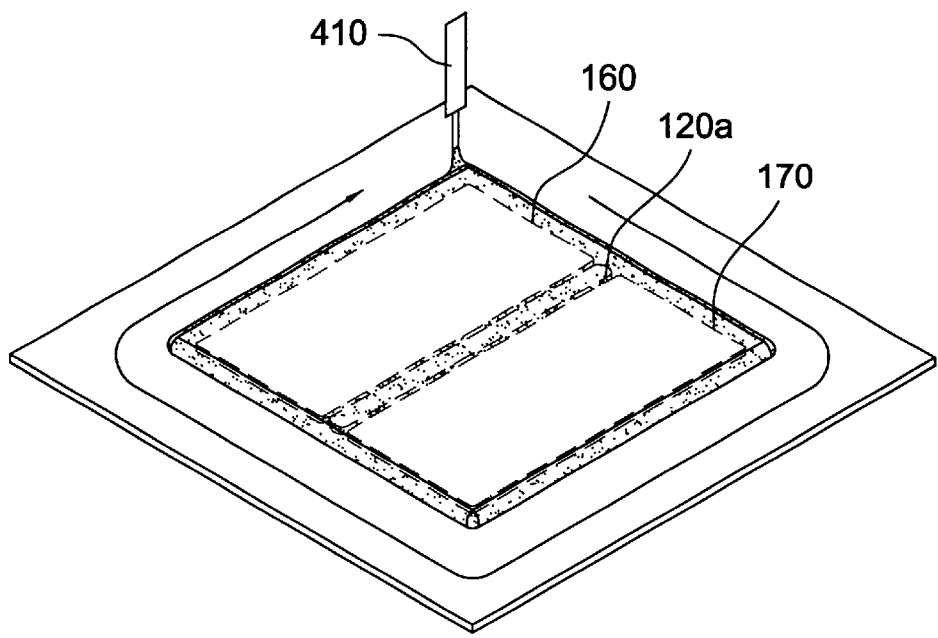

FIG. 10 illustrates an encapsulation process of the chip scale package in accordance with the present invention. First, the encapsulant is applied around the semiconductor chip through a dispenser 410 (the dispenser 410 preferably moves clockwise as indicated by the arrow shown in FIG. 10), then the encapsulant automatically fills the slot 120a of the substrate via capillary action, and finally, the encapsulant is cured to form the package body 180 by baking. Since the elastomer pads 160, 170 are respectively situated on both flanks of the slot 120a of the substrate and keep a predetermined distance from the slot 120a, the space around the chip communicates with the slot 120a of the substrate. Therefore, the encapsulant can fill the slot 120a of the substrate via capillary action.

Figure 1:
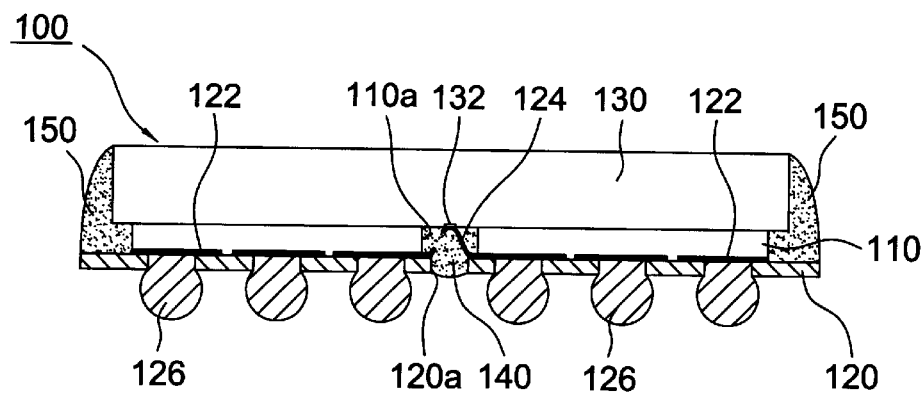
FIG. 1 is a cross-sectional view of a conventional chip scale package.
Figure 2:
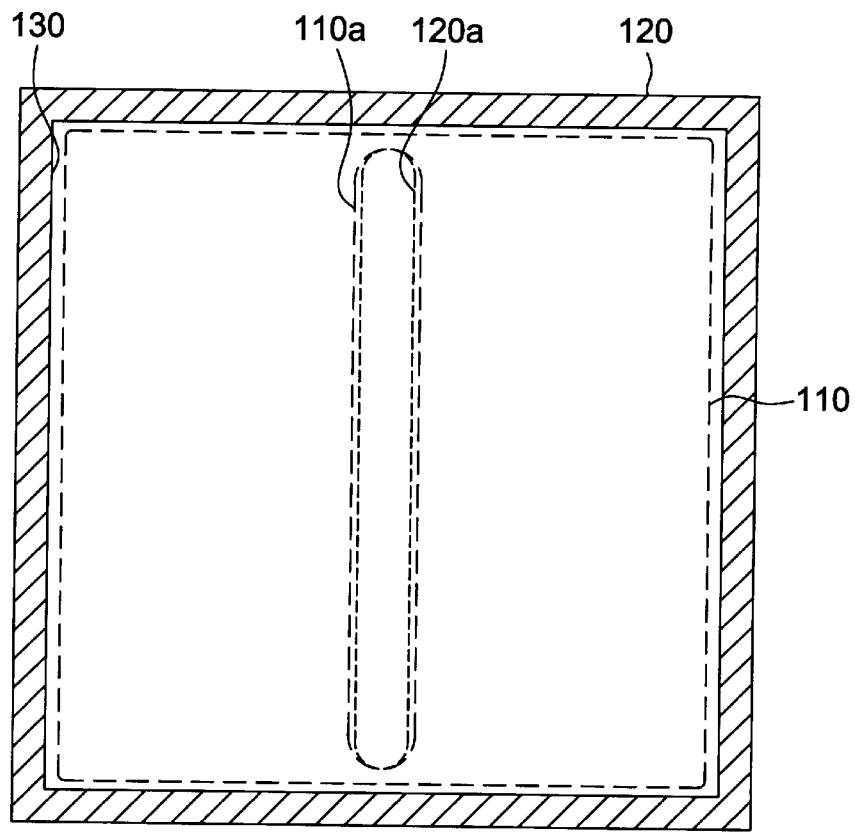
FIG. 2 is a top plan view of an elastomer pad having a slot centrally defined therein interposed between a substrate and a semiconductor chip for use in the conventional chip scale package of FIG. 1.
Figure 3:
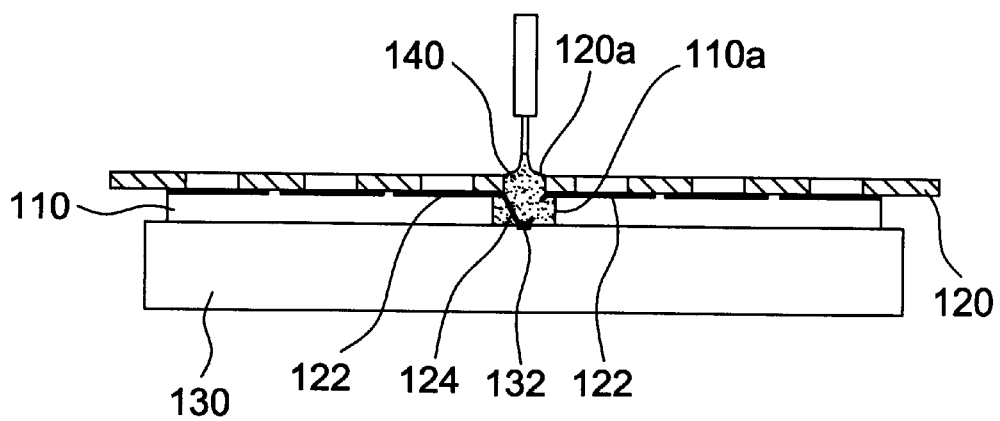
FIGS. 3–4 illustrate an encapsulation process of the conventional chip scale package of FIG. 1.
Figure 4:
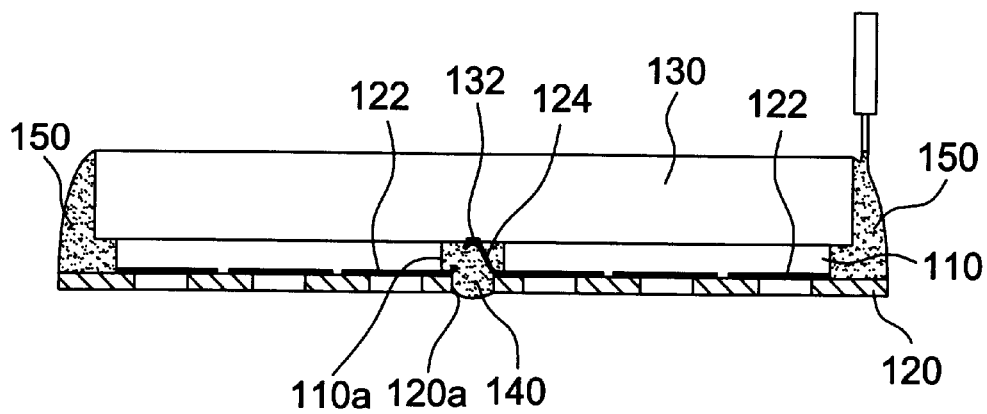

Comparatively, as shown in the conventional chip scale package 100 of FIG. 2, the elastomer pad 110 interposed between the substrate 120 and the semiconductor chip 130 will block the encapsulant from entering the slot of the substrate during dispensing encapsulant around the chip. Therefore, the encapsulation process of the conventional chip scale package 100 is carried out by repeating the steps of dispensing and curing twice.

In the above description, the encapsulation process of the package in accordance with the present invention is carried out by a single step of dispensing and curing so as to increase UPH (unit per hour) and reduces the cost for manufacturing the package. Further, since the encapsulant fills the slot of the substrate via capillary action, it is not easy for the encapsulant to overflow the slot and form flash on the substrate surface, thereby assuring the solder joint reliability of the solder pads nearby.

Although the invention has been explained in relation to its preferred embodiment, it is to be understood that many other possible modifications and variations can be made without departing from the spirit and scope of the invention as hereinafter claimed.

What is claimed is:

1. A method of making a chip scale package comprising the steps of:

providing a substrate having an upper surface, a lower surface, and a slot defined therein, the substrate being provided with a plurality of solder pads on the upper surface thereof and a plurality of leads within the slot, wherein the substrate has a plurality of through-holes corresponding to the solder pads, and each of the leads has at least one end electrically connected to the corresponding solder pad;

attaching two individual elastomer pads respectively onto the upper surface of the substrate in a manner that each of the two individual elastomer pads flanks the slot of the substrate at a predetermined distance from the slot;

providing a semiconductor chip having a plurality of bonding pads centrally formed thereon;

attaching the semiconductor chip onto the upper surface of the substrate in a manner that the bonding pads are exposed from the slot of the substrate;

electrically coupling the leads of the substrate to the bonding pads of the semiconductor chip in a manner that each of the leads is electrically connected to the corresponding bonding pad; and forming a package body having a first portion on the upper surface of the substrate around the chip and a second portion within the slot of the substrate, wherein the first portion and the second portion are formed substantially at the same time.

2. The method as claimed in claim 1, wherein the first portion of the package body is formed by dispensing encapsulant onto the upper surface of the substrate around the chip, and the encapsulant fills the slot of the substrate via capillary action so as to form the second portion of the package body substantially at the same time.

3. The method as claimed in claim 1, wherein the substrate is one of a plurality of substrates formed in a strip configuration for use in forming a plurality of substrate-based semiconductor chip package.

4. The method as claimed in claim 1, further comprising a step of mounting a plurality of solder balls to the solder pads of the substrate for external electrical connection.

* * * * *